United States Patent
Casper et al.

[11] Patent Number: 5,812,477
[45] Date of Patent: Sep. 22, 1998

[54] ANTIFUSE DETECTION CIRCUIT

[75] Inventors: Stephen L. Casper; Chris G. Martin, both of Boise, Id.

[73] Assignee: Micron Technology, Inc., Boise, Id.

[21] Appl. No.: 725,430

[22] Filed: Oct. 3, 1996

[51] Int. Cl.[6] .......................... G11C 11/40; G11C 11/417
[52] U.S. Cl. ................... 365/225.7; 365/96; 365/189.05; 365/189.09; 365/200; 327/526
[58] Field of Search .......... 365/189.01, 189.05, 365/189.09, 200, 96, 225.7; 327/525, 526

[56] References Cited

U.S. PATENT DOCUMENTS

| | | | |
|---|---|---|---|
| 5,200,652 | 4/1993 | Lee | 307/465 |
| 5,257,222 | 10/1993 | Lee | 365/96 |
| 5,257,225 | 10/1993 | Lee | 365/185 |
| 5,324,681 | 6/1994 | Lowrey et al. | 437/52 |
| 5,331,196 | 7/1994 | Lowrey et al. | 257/529 |
| 5,440,246 | 8/1995 | Murray et al. | 326/38 |
| 5,581,505 | 12/1996 | Lee | |
| 5,617,038 | 4/1997 | Houston | 324/765 |

FOREIGN PATENT DOCUMENTS

| | | |
|---|---|---|
| 0511560 | 11/1992 | European Pat. Off. . |
| 0525680 | 2/1993 | European Pat. Off. . |
| 0655743 | 5/1995 | European Pat. Off. . |

*Primary Examiner*—Viet Q. Nguyen
*Attorney, Agent, or Firm*—Schwegman, Lundberg, Woessner & Kluth, P.A.

[57] ABSTRACT

An antifuse detection circuit is described which uses a latching circuit and two antifuses. The antifuses are coupled between the latch circuit and ground. The latching circuit described is a differential circuit which can detect which one of the two antifuses has been programmed. The circuit accurately detects an antifuse which has a relatively high resistance after being programmed.

14 Claims, 5 Drawing Sheets

ANTIFUSE DETECTION CIRCUIT

TECHNICAL FIELD OF THE INVENTION

The present invention relates generally to integrated circuits and in particular the present invention relates to antifuse detection circuits.

BACKGROUND OF THE INVENTION

Programmable devices are commonly used for changing a circuit after it has been fabricated. One application of programmable devices is in the repair of integrated circuit memories. Integrated circuit memories are often fabricated with several redundant elements (rows or columns) of memory cells. Each redundant element has an associated comparison module which is formed by an array of programmable devices and which is capable of receiving a multi-bit address. The programmable devices of the array are selectively programmed to respond to a specific address as necessary to reroute memory addresses for replacing a redundant element for a failed memory element.

One type of programmable device that is commonly used for these applications is the anti-fuse. In its unprogrammed condition, the anti-fuse functions as a capacitor and presents a very high resistance on the order of 10 Megohms. To program an anti-fuse, its connections are shorted together providing a relatively low resistance path through the anti-fuse, typically presenting a resistance of about 200 to 500 ohms.

Typically, a detection circuit is used to determine the condition of an anti-fuse. The detection circuit includes a pull-up transistor that is connected in series with the anti-fuse between the Vcc rail and the ground rail of the detection circuit. A voltage level detecting circuit connects the ungrounded terminal of the anti-fuse at a detection node to the output of the detection circuit. For an unblown condition for the anti-fuse, a voltage at approximately Vcc is provided at the detection node. For a blown condition for the anti-fuse, the shorted anti-fuse connects ground to the input of the level detecting circuit. A latch arrangement, triggered by the voltage level detecting circuit, is provided to isolate the detection node and the blown anti-fuse from the Vcc rail for the blown condition for the anti-fuse.

In programming an anti-fuse, the anti-fuse may not blow clean. In such case, the anti-fuse presents a relatively high resistance which can be on the order of 400 K ohms. Accordingly, a partially blown anti-fuse forms a voltage divider in combination with the pull-up transistor so that rather than being at ground, the voltage provided at the detection node will trip the level detecting circuit, so that the detection circuit will produce an erroneous output.

For the reasons stated above, and for other reasons stated below which will become apparent to those skilled in the art upon reading and understanding the present specification, there is a need in the art for a detection circuit which can identify a programmed device, in particular a high resistance antifuse.

SUMMARY OF THE INVENTION

The above mentioned problems with detection circuits and other problems are addressed by the present invention and which will be understood by reading and studying the following specification. A detection circuit is described which uses multiple programmable devices and a latch to detect a programmed device.

An antifuse detection circuit is described which uses a latching circuit and two antifuses. The antifuses are coupled between the latch circuit and ground. The latching circuit described is a differential circuit which can detect which one of the two antifuses has been programmed. The circuit accurately detects an antifuse which has a relatively high resistance after being programmed.

In particular, the present invention describes an antifuse detection circuit comprising a latch circuit, and a plurality of antifuses coupled between the latch circuit and a common reference voltage.

In another embodiment, an antifuse detection circuit is described which comprises first and second antifuses. Each antifuse having a first node connected to a common reference voltage, and a second node connected to a latch circuit. The latch circuit comprises first and second cross-coupled p-channel transistors. A drain of the first and second p-channel transistors is connected to a second reference voltage. A source of the first p-channel transistor is coupled to a gate of the second p-channel transistor, and a source of the second p-channel transistor is coupled to a gate of the first p-channel transistor. The first antifuse is coupled to the source of the first p-channel transistor, and the second antifuse is coupled to the source of the second p-channel transistor.

In yet another embodiment, a memory device is described which comprises an array of memory cells, and control circuitry. The control circuitry comprises a latch circuit having cross-coupled transistors and a plurality of antifuses coupled between the latch circuit and a common reference voltage.

A method is described for detecting a programed antifuse. The method comprises the steps of programming a first antifuse to create a conductive path between first and second conductive plates, coupling the first conductive plate to a first reference voltage, and coupling the second conductive plate to a latch circuit. The method further includes the steps of coupling a first conductive plate of an un-programmed second antifuse to the first reference voltage, coupling a second conductive plate of the second antifuse to the latch circuit, and activating the latch circuit.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention provides a detection circuit for detecting the condition of a programmable device in an integrated circuit device. In an exemplary embodiment, the detection circuit is used to detect the condition of an anti-fuse that is employed in an integrated circuit memory, such as in a match fuse bank circuit which is used to reroute memory addresses for replacing a redundant memory row or column portion for a failed memory row or column portion. However, the detection circuit can be used anywhere an anti-fuse is used.

In the unblown state, the anti-fuse functions as a capacitor and presents a high impedance, typically on the order of about 10 Megohms, for example. In the blown state, the anti-fuse is changed permanently to a low-resistance structure, presenting a resistance of about 200 to 500 ohms, for example, if a clean blow is produced during programming. However, if the anti-fuse is only partially blown, the anti-fuse 10 can present a very high resistance on the order of about 400 K ohms, for example.

Figures 1, 2:
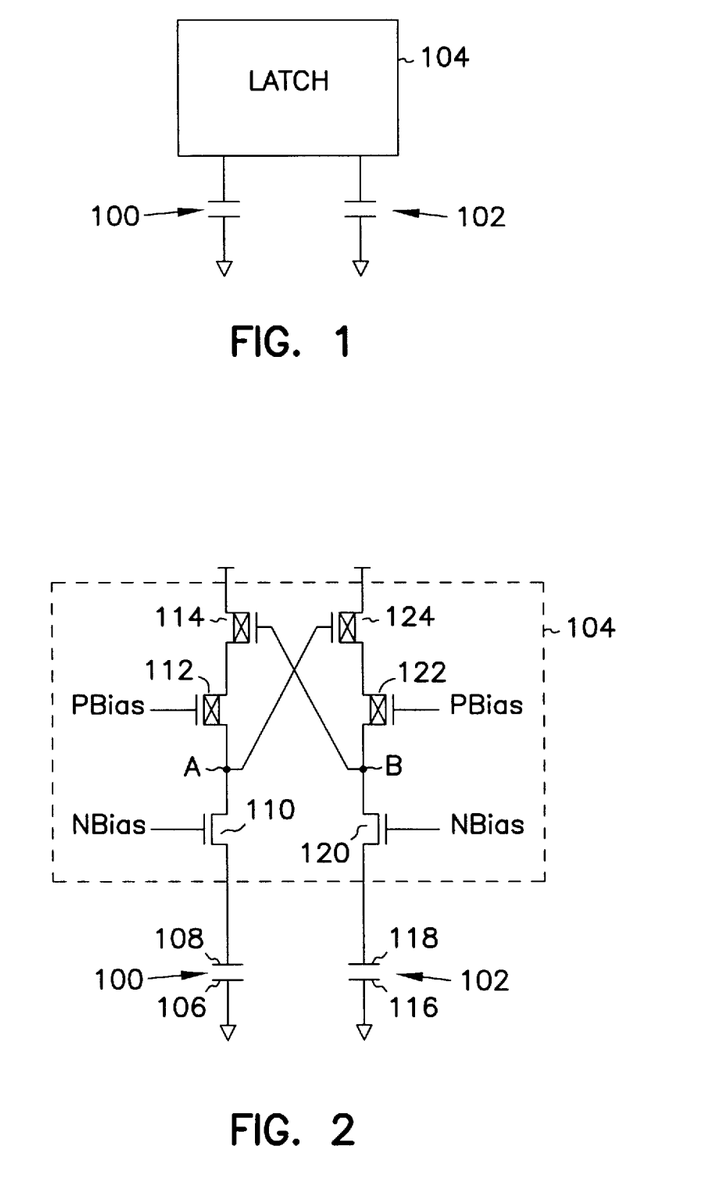
FIG. 1 is a detection circuit of the present invention.
FIG. 2 is a schematic diagram of a detection circuit of the present invention.

FIG. 1 illustrates the detection circuit of the present invention provided in an integrated circuit. Two antifuses 100 and 102 are connected to a latch circuit 104. One of the antifuses is intended to be programmed during the manufacture of the integrated circuit. The latch circuit detects which of the two antifuses has been programmed and produces an appropriate output. The latch circuit can detect partially programmed antifuses. That is, the latch can detect a programmed antifuse even if the antifuse has a relatively high resistance after programming.

FIG. 2 is a more detailed schematic diagram of a detection circuit of the present invention including antifuses and a latch 104 comprises of cross-coupled transistors 114 and 124. A first antifuse 100 has one plate 106 coupled to ground potential and a second plate 108 connected to an n-channel transistor 110. The gate of the n-channel transistor is connected to receive a bias voltage, and its drain is connected to p-channel transistor 112. The drain of transistor 110 is labeled node A in FIG. 2. The gate of transistor 112 is connected to receive a second bias voltage. P-channel transistor 114 is connected between transistor 112 and a positive voltage supply.

A second antifuse 102 has one plate 116 coupled to ground potential and a second plate 118 connected to an n-channel transistor 120. The gate of the n-channel transistor is connected to receive a bias voltage, and its drain is connected to p-channel transistor 122. The drain of transistor 120 is labeled node B in FIG. 2. The gate of transistor 122 is connected to receive a second bias voltage. P-channel transistor 124 is connected between transistor 122 and a positive voltage supply. The gate of transistor 114 is connected to node B, and the gate of transistor 124 is connected to node A.

In operation, transistors 110–124 function as a differential latch. That is, nodes A and B are latched to opposite states depending upon the voltage drops across antifuses 100 and 102. By programming one of the antifuses, the remaining antifuse operates as a reference circuit.

P-channel transistors 112 and 122 are provided to assist a programmed antifuse in correcting nodes A and B. That is, if nodes A and B are latched in the incorrect state, the p-channel transistors reduce the voltage potential on the nodes to assist the programmed antifuse in overcoming the incorrect state. N-channel transistors 110 and 120 are provided to reduce the potential drop across antifuses 100 and 102, particularly when the antifuses are in an unprogrammed state. This is to insure that a large voltage drop is not provided across the plates of the antifuse and erroneously programs the antifuse.

Figure 3:
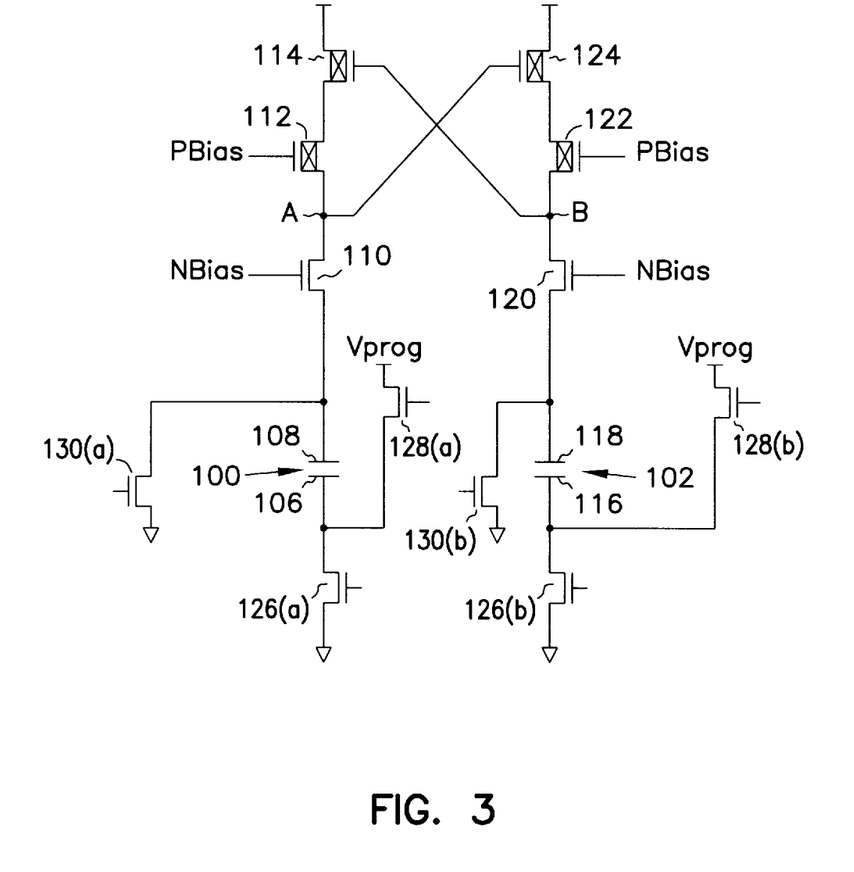
FIG. 3 is a schematic diagram of a detection circuit of the present invention including programming circuitry.

FIG. 3 illustrates one embodiment of program circuitry which can be used to program one of the antifuses 100 or 102. The program circuit includes transistors 126, 128 and 130. Under normal operation, isolation transistors 126(*a*) and 126(*b*) are turned on such that plates 106 and 116 of the antifuses are coupled to ground. To program one of the antifuses, transistors 126 (*a*) and 126(*b*) are turned off to isolate the antifuses from ground. Likewise transistors 110 and 120 are turned off to electrically isolate the antifuses from the latch circuit. Transistors 128(*a*) and 128(*b*) are then turned on to couple plates 106 and 116 to a program voltage, Vprog. Either transistor 130(*a*) or transistor 130(*b*) is then activated to couple either plate 108 or 118 to ground. It will be appreciated that the antifuse coupled to Vprog and ground will be programmed such that a low resistance path is created between the antifuse plates, as known to one skilled in the art. The program transistors 128 and 130, therefore, are designed to withstand a substantial current. As stated above, the process of programming an antifuse is subject to variables and the resultant antifuse resistance can vary greatly. For example, an unprogrammed antifuse resistance is in the order of 10 M ohms, and the programmed antifuse can vary between tens of ohms and several hundred thousand ohms.

Figure 4:
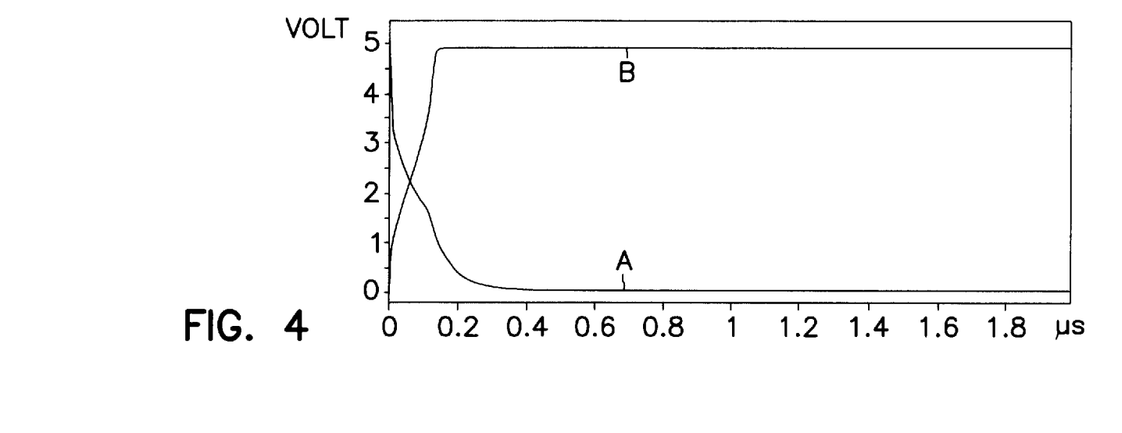
FIG. 4 is a timing diagram of the operation of the circuit of FIG. 2.

The timing diagram of FIG. 4 illustrates the operation of the circuit of FIG. 2 where antifuse 100 has been programmed using the program circuitry described with reference to FIG. 3. For purposes of illustration, antifuse 100 has been programmed and has a plate-to-plate resistance of approximately 400 k ohms. Antifuse 102 is unprogrammed and has a plate-to-plate resistance of approximately 10 M ohms. To illustrate the ability of the detection circuit to correctly detect a programmed antifuse, Nodes A and B are initially at a high voltage level and a low voltage level, respectively. With transistors 110, 112, 120 and 122 active, antifuse 100 begins to pull node A low through transistor 110. Transistor 124 begins to turn on as node A goes low, thus pulling node B high and turning off transistor 114. Node A is pulled low and node B is pulled high to indicate that antifuse 100 has been programmed and antifuse 102 is unprogrammed.

Figure 5:
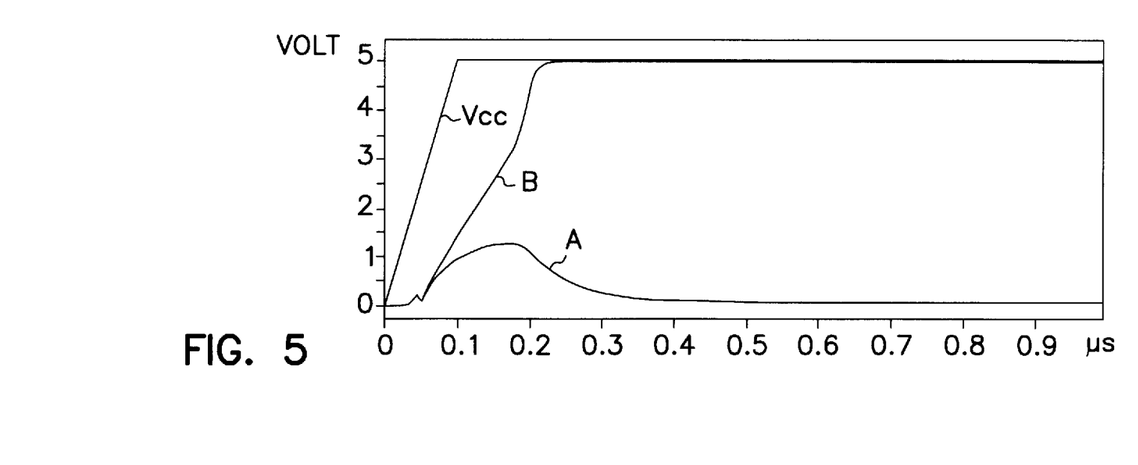
FIG. 5 is another timing diagram of the operation of the circuit of FIG. 2
Figure 6:
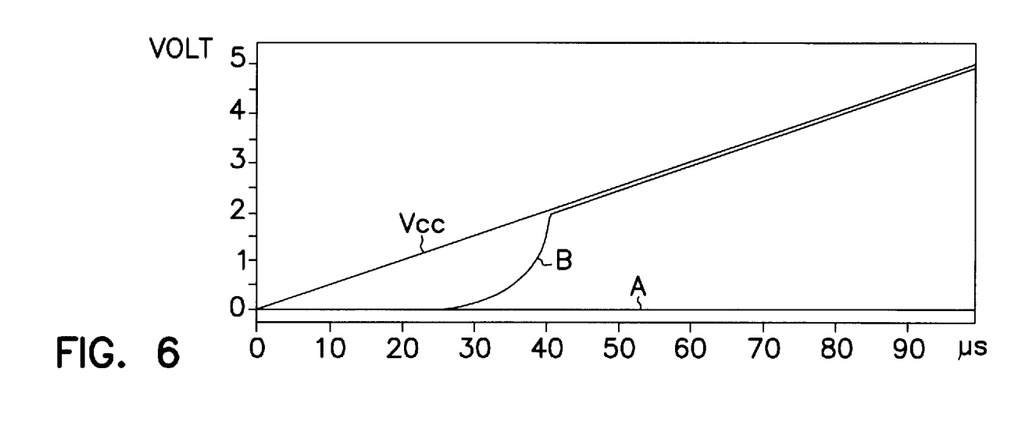
FIG. 6 is yet another timing diagram of the operation of the circuit of FIG. 2.

FIG. 5 is a timing diagram of the circuit of FIG. 2 having antifuse 100 programmed. Antifuse 100 has a plate-to-plate resistance of approximately 400 k ohms. Antifuse 102 is unprogrammed and has a plate-to-plate resistance of approximately 10 M ohms. The timing diagram illustrates the ability of the detection circuit to correctly identify a programmed antifuse upon initial power-up. Upon power-up, the supply voltage, Vcc, transitions from 0 volts to 5 volts in 100 ns. Nodes A and B are stabilized at the appropriate values within approximately 400 ns. Further, FIG. 6 illustrates the same circuit operation where the power supply transitions to 5 volts in 100 µs. In this power-up illustration, Nodes A and B are stabilized at the appropriate values within approximately 40 µs.

Figure 7:
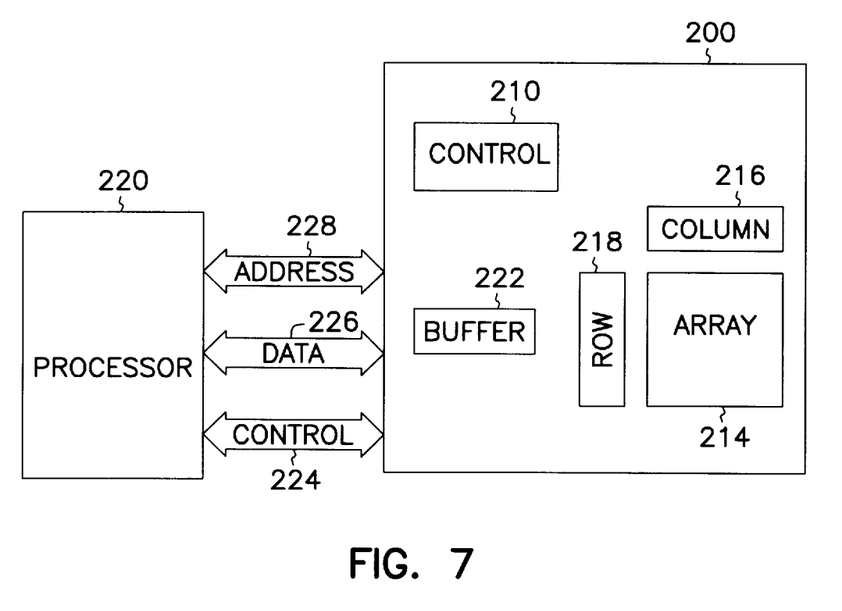
FIG. 7 is a block diagram of a system of the present invention.

FIG. 7 illustrates an integrated circuit device including the antifuse detection circuit. The device can be a memory circuit 200 such as a dynamic random access memory (DRAM) which is coupled to a processor 220. The memory device can be coupled to a processor 220 such as a microprocessor of a personal computer. The memory device 200 includes a memory array 214 having rows and columns of memory cells. The array includes both primary and redundant memory cells. Column decoder 216 and row decoder 218 are provided to access the memory array in response to address signals provided by the processor 220 on address communication lines 228. Data communication is conducted via I/O buffer circuitry 222 and bi-directional data communication lines 226 (DQ). Internal control circuitry 210 accesses the memory array in response to commands provided by the processor 220 on control lines 224. The control circuitry includes antifuses and detection circuitry described in detail above. The antifuses can be used for numerous purposes, but are particularly useful in redundant circuitry for enabling redundant memory cells to replace defective primary cells. That is, after detecting a defective primary memory cell in the memory, an antifuse can be programmed to substitute the defective cell with a redundant memory cell. The control lines can include Row Address strobe (RAS*), Column Address Strobe (CAS*), Write Enable (WE*), and Output Enable (OE*). It will be appreciated by those skilled in the art that the present invention is equally applicable to other types of memory devices including, but not limited to, SRAM, SDRAM, EDO, Burst EDO, and VRAM.

It will be appreciated by those skilled in the art that variations of the latch and program circuits can be provided without departing from the present invention. As such transistors 110–122 can be either p-channel or n-channel, or eliminated from the latch circuit entirely. Further, the programming circuitry described is one embodiment and numerous alternative programing circuits known to one skilled in the art can be used with the present invention.

Conclusion

An antifuse detection circuit has been described which uses a latching circuit and two antifuses. The antifuses are coupled between the latch circuit and ground. The latching circuit described is a differential circuit which can detect which one of the two antifuses has been programmed. The circuit accurately detects an antifuse which has a relatively high resistance after being programmed.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An antifuse detection circuit comprising:
   first and second antifuses, each antifuse having a first node connected to a common reference voltage, and a second node connected to a latch circuit; and
   the latch circuit comprising first and second cross-coupled p-channel transistors, a drain of the first and second p-channel transistors is connected to a second reference voltage, a source of the first p-channel transistor is coupled to a gate of the second p-channel transistor, a source of the second p-channel transistor is coupled to a gate of the first p-channel transistor, the first antifuse is coupled to the source of the first p-channel transistor, and the second antifuse is coupled to the source of the second p-channel transistor.

2. The antifuse detection circuit of claim 1 further comprising:

first n-channel transistor having a drain connected to the gate of the second p-channel transistor, a source connected to the first node of the first antifuse, and a gate connected to receive a bias voltage; and
   second n-channel transistor having a drain connected to the gate of the first p-channel transistor, a source connected to the first node of the second antifuse, and a gate connected to receive the bias voltage.

3. The antifuse detection circuit of claim 1 further comprising:
   third p-channel transistor having a drain connected to the source of the first p-channel transistor, a source coupled to the first antifuse, and a gate connected to receive a bias voltage; and
   fourth p-channel transistor having a drain connected to the source of the second p-channel transistor, a source coupled to the second antifuse, and a gate connected to receive the bias voltage.

4. The antifuse detection circuit of claim 1 further comprising:
   programming circuitry connected to the first and second antifuses for selectively programming one of the antifuses.

5. A method of detecting a programed antifuse, the method comprising the steps of:
   programming a first antifuse to create a conductive path between first and second conductive plates;
   coupling the first conductive plate to a first reference voltage;
   coupling the second conductive plate to a latch circuit;
   coupling a first conductive plate of an un-programmed second antifuse to the first reference voltage;
   coupling a second conductive plate of the second antifuse to the latch circuit; and
   activating the latch circuit.

6. The method of claim 5 wherein the latch circuit comprises a pair of cross-coupled p-channel transistors.

7. The method of claim 5 wherein the step of programming a first antifuse comprises the steps of:
   electrically isolating the first antifuse from the latch circuit; and
   providing a voltage across the first and second conductive plates having a potential difference sufficient to create the conductive path between first and second conductive plates.

8. A method of repairing a memory device, the method comprising the steps of:
   detecting a defective primary circuit;
   selectively programing an antifuse;
   coupling the antifuse between a reference voltage and a latch circuit;
   coupling an un-programmed second antifuse to the reference voltage and the latch circuit;
   activating the latch circuit to detect the programmed antifuse; and
   enabling a redundant circuit to replace the defective primary circuit.

9. The antifuse detection circuit of claim 1 further comprising:
   antifuse programming circuitry connected to the first and second antifuses for selectively programming one of the antifuses.

10. The antifuse detection circuit of claim 9 wherein the antifuse programming circuitry comprises:

a first isolation transistor connected to the first node of the first antifuse to isolate the first node from the reference voltage;

a first programming transistor having a drain adapted to receive a program voltage and a source connected to the first node of the first antifuse;

a second programing transistor having a drain connected to the second node of the first antifuse, and a source connected to receive the reference voltage;

a second isolation transistor connected to the first node of the second antifuse to isolate the first node from the reference voltage;

a third programming transistor having a drain adapted to receive a program voltage and a source connected to the first node of the second antifuse; and a fourth programing transistor having a drain connected to the second node of the second antifuse, and a source connected to receive the reference voltage.

11. A memory device comprising:

an array of memory cells; and an antifuse detection circuit comprising, first and second antifuses, each antifuse having a first node connected to a common reference voltage, and a second node connected to a latch circuit, and the latch circuit comprising first and second cross-coupled p-channel transistors, a drain of the first and second p-channel transistors is connected to a second reference voltage, a source of the first p-channel transistor is coupled to a gate of the second p-channel transistor, a source of the second p-channel transistor is coupled to a gate of the first p-channel transistor, the first antifuse is coupled to the source of the first p-channel transistor, and the second antifuse is coupled to the source of the second p-channel transistor.

12. The memory device of claim 11 further comprising:

redundant circuitry coupled to the array of memory cells and the control circuitry, and adapted to enable redundant memory cells in response to the first and second antifuses.

13. The memory device of claim 11 further comprising antifuse programming circuitry connected to the first and second antifuses for selectively programming one of the antifuses.

14. The memory device of claim 13 wherein the antifuse programming circuitry comprises:

a first isolation transistor connected to the first node of the first antifuse to isolate the first node from the reference voltage;

a first programming transistor having a drain adapted to receive a program voltage and a source connected to the first node of the first antifuse;

a second programing transistor having a drain connected to the second node of the first antifuse, and a source connected to receive the reference voltage;

a second isolation transistor connected to the first node of the second antifuse to isolate the first node from the reference voltage;

a third programming transistor having a drain adapted to receive a program voltage and a source connected to the first node of the second antifuse; and a fourth programing transistor having a drain connected to the second node of the second antifuse, and a source connected to receive the reference voltage.

* * * * *

UNITED STATES PATENT AND TRADEMARK OFFICE
CERTIFICATE OF CORRECTION

PATENT NO. : 5,812,477
DATED : September 22, 1998
INVENTOR(S) : Stephen L. Casper; Chris G. Martin, both of Boise, ID.

It is certified that error appears in the above-identified patent and that said Letters Patent is hereby corrected as shown below:

At Col. 6, line 3, please delete "a source connected to the first node of the first antifuse," and insert --a source connected to the second node of the first antifuse,--

At Col. 6, line 7, please delete "a source connected to the first node of the second antifuse," and insert --a source connected to the second node of the second antifuse,--

Signed and Sealed this

Fifteenth Day of February, 2000

Q. TODD DICKINSON

*Attest:*

*Attesting Officer*    *Commissioner of Patents and Trademarks*